United States Patent [19]

Rosback

[11] Patent Number: 4,641,361
[45] Date of Patent: Feb. 3, 1987

[54] MULTI-BAND AUTOMATIC GAIN CONTROL APPARATUS

[75] Inventor: Thomas J. Rosback, Quincy, Ill.

[73] Assignee: Harris Corporation, Quincy, Ill.

[21] Appl. No.: 721,903

[22] Filed: Apr. 10, 1985

[51] Int. Cl.$^4$ .............................................. H03G 3/00
[52] U.S. Cl. ..................................... 381/103; 381/99; 381/102; 330/278
[58] Field of Search ............... 381/102, 106, 108, 103, 381/99, 100; 330/126, 281, 278, 279, 295

[56] References Cited

U.S. PATENT DOCUMENTS

| | | | |
|---|---|---|---|
| 4,177,356 | 12/1979 | Jaeger | 381/103 |
| 4,249,042 | 2/1981 | Orban | 381/106 |
| 4,406,923 | 9/1983 | Burne | 381/108 |
| 4,423,289 | 12/1983 | Swinbanks | 381/99 |
| 4,429,181 | 1/1984 | Freadman | 381/99 |
| 4,508,940 | 4/1985 | Steeger | 381/106 |
| 4,525,857 | 6/1985 | Orban | 381/100 |

Primary Examiner—Gene Z. Rubinson
Assistant Examiner—L. C. Schroeder
Attorney, Agent, or Firm—Yount & Tarolli

[57] ABSTRACT

A multiple band automatic gain control circuit having a band splitter which is responsive to an input audio signal for separating the audio signal into plural components of different frequencies. Plural gain adjustment circuits each control the gain of an associated one of the components, wherein each of the gain adjustment circuits includes a voltage controlled amplifier, and feed forward control elements for controlling the voltage controlled amplifier as a function of the amplitude of the associated component. A signal combiner combines the gain adjusted components to thereby form a gain adjusted audio signal. A limiter circuit prevents the combined signal from exceeding predetermined amplitude constraints by simultaneously reducing the gain of all of the variable gain circuits whenever the combined signals exceed the predetermined constraints.

20 Claims, 5 Drawing Figures

MULTI-BAND AUTOMATIC GAIN CONTROL APPARATUS

BACKGROUND AND FIELD OF THE INVENTION

The present invention relates to automatic gain control (AGC) circuits, and more particularly to AGC circuits wherein the gain of a signal is adjusted in multiple different frequency bands.

Automatic gain control circuits are widely used in different types of signal processing environments. In the area of commercial broadcasting, automatic gain control circuits are used to compress the dynamic range of an audio frequency signal to render it more compatible for broadcast transmission.

Several known automatic gain control circuits adjust the gain of the input audio signal in multiple different frequency channels. In the multi-band circuit disclosed in the patent to Orban, U.S. Pat. No. 4,249,042, for example, the input audio signal is first separated into three different frequency components, and the gain of each of the three components is adjusted in a separate feedback loop. The three gain adjusted components are then recombined to provide a gain controlled audio output signal. Other multi-band signal processing circuits are disclosed in U.S. Pat. Nos. 4,412,100 and 4,208,548.

SUMMARY OF THE INVENTION

It is an object of the present invention to improve upon existing multi-band automatic gain control circuit.

It is another object of the present invention to use the same gain control elements both for automatic gain control in a multiband automatic gain control circuit, and for peak limiting of the output signal provided by the automatic gain control circuit.

It is still another object of the present invention to provide a multiple band automatic gain control circuit which does not use feedback to control the gains in the individual bands.

It is a further object of the present invention to provide a multiple band automatic gain control circuit including a band splitter circuit having "perfect" amplitude and phase response.

It is yet another object of the present invention to provide a multiple band automatic gain control circuit wherein the circuit response characteristics in the individual bands can be simultaneously controlled.

In accordance with the teachings of the present invention, a multiple band automatic gain control circuit is provided. The circuit includes a band splitter which is responsive to an input audio signal for separating the audio signal into plural components of different frequencies. Plural gain adjustment means are provided for each controlling the gain of an associated one of the components, wherein each of the gain adjustment means includes variable gain means, and feed forward control means for controlling the variable gain means as a function of the amplitude of the associated component. A signal combiner combines the gain adjusted components to thereby form a gain adjusted audio signal. A limiter circuit prevents the combined signal from exceeding predetermined amplitude constraints by simultaneously reducing the gain of all of the variable gain circuits whenever the combined signals exceed the predetermined constraints.

The various individual elements of the system, notably the band splitter, clipper/limiter, and feed forward control elements, include numerous improvements over the prior art.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
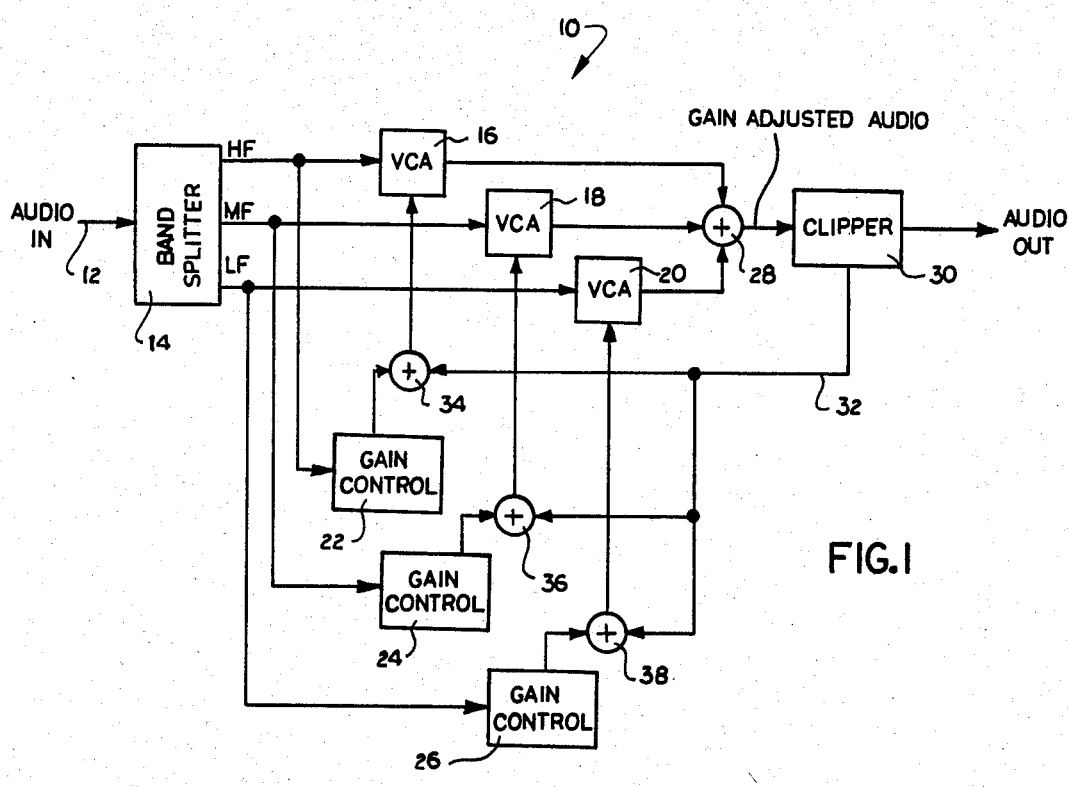
FIG. 1 is a block diagram of a multiple band automatic gain control circuit in accordance with the teachings of the present invention.

FIG. 1 is a block diagram of a multiple band automatic gain control (AGC) circuit which utilizes the same voltage controlled amplifiers for both automatic gain control and signal limiting functions. The AGC circuit 10 has an input line 12 receiving an audio signal for processing. The audio input signal may be derived from an audio mixing console, for example, or from any other conventional signal source. A band splitter 14 separates the audio input signal into three frequency components: a high band frequency component (HF), a midband frequency component (MF), and a low band frequency component (LF). The band splitter 14 preferably has the novel design illustrated in FIG. 2, to be described hereinafter.

Each frequency component is processed in a separate gain adjustment circuit. The high band gain adjustment circuit includes a voltage controlled amplifier (VCA) 16 and a corresponding gain control circuit 22. Gain control circuit 22 controls the gain of voltage controlled amplifier 16 as a function of the magnitude of the high band signal at the output of band splitter 14. Stated differently, the high band amplitude information is fed forward to control the voltage controlled amplifier 16 through the gain control circuit 22. The midband and low band signals are processed through similar VCA and gain control circuits (18, 20, 24, 26). In the embodiment currently being described, the voltage controlled amplifiers are db-linear, meaning that the gain of the amplifier, in decibels, is an inverse linear function of the gain control signal (gain decreases with increasing gain control input signal). The VCAs may, for example, be monolithic integrated circuits manufactured and sold commercially by DBX Corporation under the designation DBX2151.

As the input singal increases in amplitude, the gain control signals provided by the gain control circuits increase also, leading to decrease in the gain of each VCA. Similarly, as the input signal diminishes in amplitude, the gain control signals also diminish, producing an increase in the gain of each VCA. The net result is that the dynamic range of the input signal is compressed.

Since the AGC circuit of FIG. 1 uses feed forward control paths, it is not subject to the instability problems inherent in feedback controlled systems. The dynamic range of the circuit can thus be made arbitrarily large without introducing instability into the system. In the example being described, the circuit has been given a broad dynamic range enabling gain compression in excess of 40 db.

The three gain control circuits operate largely (but not completely) independent of one another. Some dynamic change in the frequency characteristics of the audio signal is produced by the multi-band AGC circuit due to nonuniform gain across the three bands. The high band and low band gain control lines are strapped to the midband, however, by cross-coupling lines not shown in FIG. 1. The gain strapping insures that the gains in the high and low bands never deviate from the midband gain by more than a selected amount. The three gain control circuits also share certain other control lines so that the control characteristics of the automatic gain control circuit is relatively uniform across the three frequency bands. This is discussed further hereinafter with reference to FIG. 3.

The three gain adjusted frequency components produced by the VCAs 16, 18 and 20 are recombined in a signal adder 28. The combined, gain adjusted audio signal at the output of adder circuit 28 is applied to the input of a clipper/limiter 30. The clipper/limiter 30 compares the amplitude of the gain adjusted audio signal with positive and negative limits, providing a control signal on an output line 32 in accordance with the results of the comparisons. The control signal on the control line 32 is added into the gain control signals for the VCAs 16, 18 and 20 so that the clipper/limiter can simultaneously affect a reduction of the gains in all three channels. Adder circuit 34 adds the clipper/limiter control signal with the gain control signal at the output of gain control circuit 22, whereas adder circuits 36 and 38 perform similar functions for the other two frequency bands.

If the gain adjusted audio signal at the output of adder circuit 28 exceeds the limits established within clipper/limiter 30, the control signal on the clipper/limiter control line 32 changes in a direction to reduce the gains of the three VCAs 16, 18 and 20. The gain in the three frequency bands continues to be reduced until the audio signal no longer exceeds the clipping limits. The gain reduction action occasioned by the clipper/limiter circuit 30 takes place without significant delay whenever the gain adjusted audio signal exceeds the limits, and similarly the gain increases without significant delay as soon as the gain adjusted audio signal drops below the clipping limits.

Figure 2:
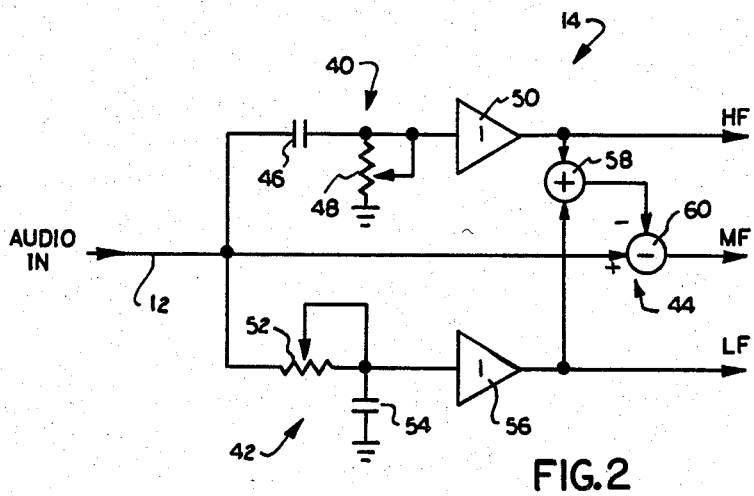
FIG. 2 is a more detailed schematic of the band splitter used in the AGC circuit of FIG. 1.

FIG. 2 is a more detailed schematic illustration of the band splitter 14 of FIG. 1. As shown in FIG. 2, band splitter 14 includes a high pass filter 40, a low pass filter 42, and a band pass network 44. High pass filter 40 is a conventional first order RC filter including a series capacitor 46 and a shunt potentiometer 48. Adjustment of the potentiometer 48 adjusts the break point of the high pass filter 40. The filter output is buffered by a unity gain buffer 50 of conventional design. The output of the buffer 50 represents the high band output of the band splitter 14.

Low pass filter 42 similarly uses a first order, RC filter including a series potentiometer 52 and a shunt capacitor 54. Adjustment of the potentiometer 52 adjusts the roll off frequency of the low pass filter, and thus the range of frequencies within the low band. The low pass filter output is buffered by a unity gain buffer 56. The output of the unity gain buffer 56 represents the low band output of the band splitter 14.

The midband output of the band splitter 14 is developed without use of a bandpass filter, per se. Instead, the bandpass characteristic is synthesized by subtracting the outputs of the high and low bands from the original input signal. The circuit for doing this is schematically represented in FIG. 2 as an adder 58 and subtractor 60. The adder 58 sums the high band and low band signals, and the subtractor 60 subtracts the combined high and low band signals from the input audio signal. The output of the subtractor 60 contains only those frequencies which are absent from both the high and the low band, which in turn corresponds to the frequencies between the cutoff frequencies of the high pass and low pass filters.

The band splitter 14 of FIG. 2 has several advantages over other band splitting filters conventionally used in multi-band AGC circuits. One advantage is that the skirts of the band pass characteristic in the midband roll off at the same six decibel per octave rate as the skirts of the high and low bands. It should be noted that single order filters are the only types of filters which could be used in the band splitter without producing error terms or asymmetrical stop band slopes in the band pass response. Another advantage is that a summation of the three signals would necessarily reconstruct the original signal since the original signals were derived by subtraction in the first place. The band splitter could thus be said to have perfect amplitude and phase response.

Figure 3:
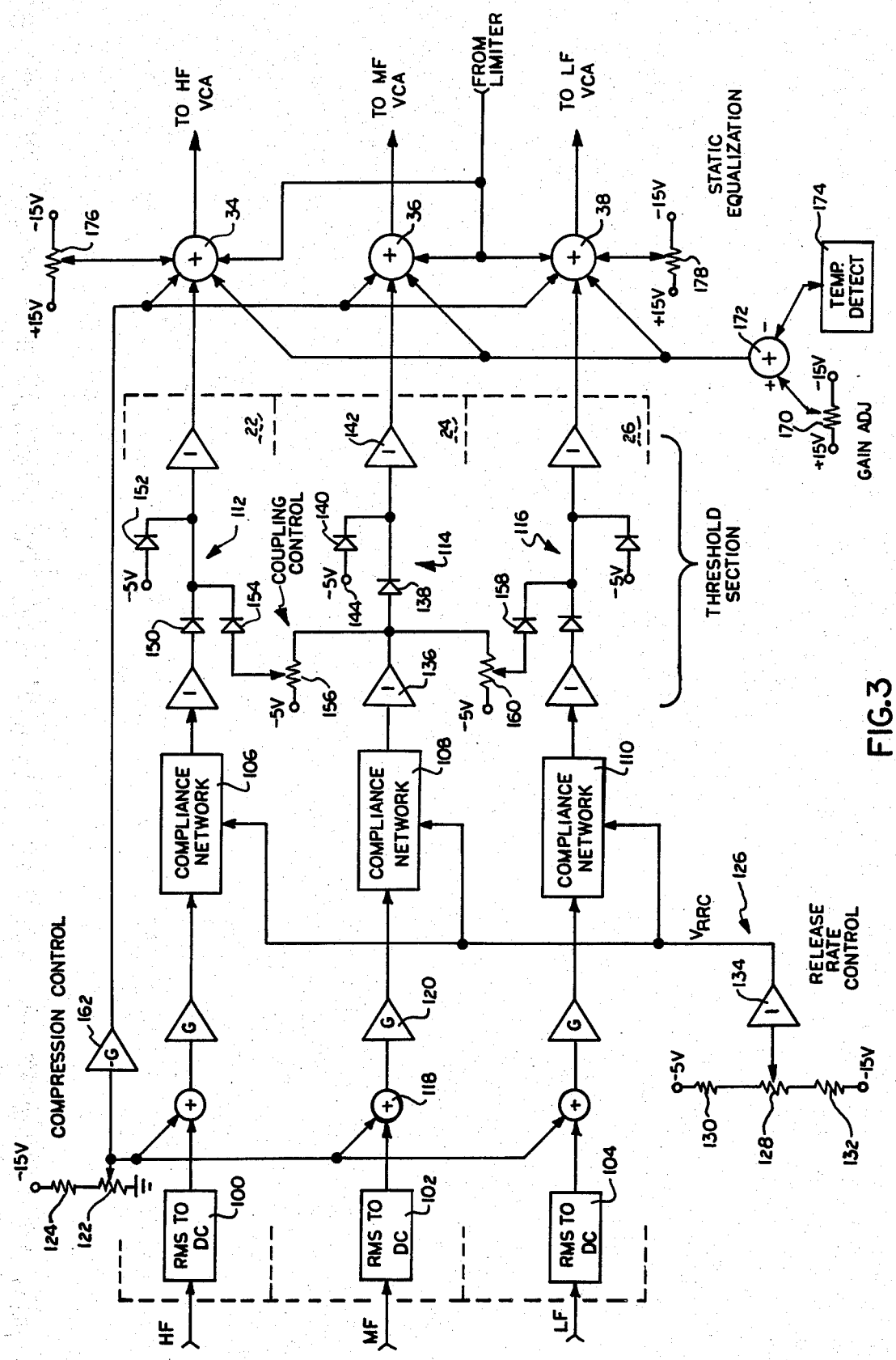
FIG. 3 is a more detailed representation of the gain control circuitry used in the embodiment of FIG. 1.

FIG. 3 is a more detailed circuit schematic of the VCA control circuitry from the system of FIG. 1. In FIG. 3, each of the three gain control circuits 22, 24 and 26 is shown as including three principal elements: an RMS-to-DC converter (100, 102, 104); a compliance network (106, 108, 110); and a threshold section (112, 114, 116). Attention is first directed to the midband control circuit 24. The RMS-to-DC converter 102 is a monolithic RMS-to-DC converter commercially available from DBX Corporation, under the designator DBX2252. The converter 102 is a db-linear device which provides an output signal linearly indicative of the average RMS value (in decibels) of the applied input signal. At lower signal frequencies, however, the RMS converter will tend to follow the envelope of the signal, rather than its RMS value.

The averaging time of the RMS-to-DC converter 102 is selectable and preferably is set to around 3 milliseconds in order to allow transient attacks of musical waveforms to pass through the AGC amplifier without substantial modification. (The averaging times of the other two RMS to DC converters 100 and 104 should be the same as the averaging time constant of converter 102 in order to insure that the summed response of the three bands at the output of the amplifier does not contain any transient errors. If the three RMS to DC converters had different time constants, the gains in the three different channels would change at different rates, leading to transient errors in the triband AGC amplifier output.)

The output of the converter 102 is a varying DC voltage which is proportional to the envelope of the input signal (in decibels) at low signal frequencies, and is proportional to the RMS value of the input signal (in decibels) at higher frequencies.

The output of converter 102 is applied to the input of compliance network 108 through a signal adder 118 and amplifier 120. The amplifier 120 is included because the output of the converter 102 is quite low level, and it is desirable to amplify it to higher levels before further processing. The signal adder 118 combines the output of converter 102 with a manually adjustable DC voltage provided by a potentiometer 122. The potentiometer 122 is connected in series with a resistor 124 across a DC supply, such that the output signal provided by the potentiometer 122 is a DC signal having a level dependent upon the position of the potentiometer. The input signal level required to initiate gain reduction action is dependent upon the DC level of the signal applied to the threshold section 114, and hence the degree of compression provided by the AGC circuit can be controlled through adjustment of potentiometer 122.

The compliance circuit 108 is an attack/release circuit having a very quick attack time, and a much slower release rate. The release rate can be adjusted by adjusting the level of the voltage ($V_{RRC}$) applied to a release control line by a release rate control circuit 126. Release rate control circuit 126 includes a voltage divider with a potentiometer 128 connected across a voltage source in series with two fixed-value resistors 130 and 132. The voltage on the wiper arm of potentiometer 128 is buffered by a buffer amplifier 134 and then applied to the release rate control line of the compliance network 108. The same control voltage $V_{RRC}$ is also applied to the release rate control lines of the other two compliance circuits. The three compliance networks 106, 108 and 110 have similar responses to the release rate control voltage generated by control circuit 126, hence the release rates of the three compliance networks are simultaneously altered in matching amounts through adjustment of the potentiometer 128.

The output of compliance network 108 is a DC level which generally follows the peak of the signal applied to its input, rapidly increasing to match a new peak level, and slowly releasing thereafter. The output of compliance network 108 is directed to the threshold section 114 through a unity gain buffer amplifier 136.

Threshold section 114 is represented in FIG. 3 as two diodes 138 and 140. The two diodes form a circuit commonly referred to as a diode "OR" gate. The two diodes nonadditively mix two input signals; a —5 volt signal and the signal at the output of buffer amplifier 136. Thus, the output of the diode "OR" gate will be —5 volts unless the signal at the output of compliance network 108 is greater than —5 volts. Negative 5 volts therefore represents a threshold voltage which must be reached before gain reduction takes place. The output of the diode "OR" gate is applied to the midband voltage controlled amplifier through a buffer amplifier 142 and the signal adder circuit 36.

The high band and low band gain control circuits 22 and 26 include elements identical to the midband control circuit elements described above. Both the high band and low band thus include signal adders for combining the outputs of the respective RMS-to-DC converters with the compression control signal, and each of the compliance networks 106 and 110 is responsive to the release rate control signal provided by release rate control circuit 126. Unlike the midband threshold section, however, the high and low band threshold sections include three inputs. The third input is used to strap the gain controls of the upper and lower bands to the gain level in the midband.

Threshold section 112, for example, includes diodes 150 and 152 whose functions are the same as the functions of diodes 138 and 140 in threshold section 114. The high band threshold section 112 includes a third diode 154, however, which nonadditively combines a third signal derived from a potentiometer 156. Potentiometer 156 has its resistance path connected between a —5 volt supply and the output of midband buffer amplifier 136. If the wiper arm of the potentiometer 156 is moved to the extreme right (as viewed in FIG. 3), the input to the diode 154 will be connected directly to the output of buffer amplifier 136. The output of threshold section 112 will then comprise either —5 volts or the greater of the outputs of compliance circuits 106 and 108. The gain in the high band will thus be reduced whenever demanded by either the high band or midband circuits. When the wiper arm of potentiometer 156 is moved to the other extreme, however, —5 volts appears on the input side of diode 154. The third input then has no effect on the operation of the high band threshold section. Adjustment of the coupling control potentiometer 156 between the two extremes establishes the degree to which the gain in the midband circuit limits the gain in the high band circuit.

The threshold section 116 of the low band includes a similar diode 158 and a similar coupling control potentiometer 160, whereby the degree of coupling between the midband and low band can be adjusted independently of the coupling between the high band and midband gain control circuits.

In FIG. 1, the signal adder circuits 34, 36 and 38 are shown, for simplicity of illustration, as each combining only the output of the associated gain control circuit with the output of the clipper/limiter circuit 30. In the specific embodiment shown in FIG. 3, however, each of the adder circuits 34, 36 and 38 is actually shown as summing, not only those two signals, but also the compression control signal, a static equalization signal, and a gain adjustment signal. The compression control signal provided by potentiometer 122 is applied to the input of summing circuits 34, 36 and 38 through an amplifier 162. The gain of amplifier 162 is selected to be the inverse of the gain experienced by the compression control signal as its passes through the signal processing chain including adder 118, amplifier 120, compliance network 108, etc., before reaching adder 36. Therefore, when the compression control potentiometer 122 is adjusted so as to adjust the point at which gain reduction takes place, the existing gain control signal is automatically compensated for the resulting change in the DC level of the output signals provided by each gain control circuit. As a result, no net change in the immediate gain of the voltage controlled amplifier takes place. Compression control is therefore effectively decoupled from gain control, permitting the two to be adjusted independently of one another.

The gain in the three channels of the automatic gain control amplifier can be manually set by a potentiometer 170 whose resistance path is connected between positive and negative DC supplies. The wiper arm of the gain adjustment potentiometer 170 is coupled to the input of all three VCA adders 34, 36 and 38 through a subtractor circuit 172. Adjustment of the gain adjustment potentiometer 170 therefore effects a corresponding adjustment of the DC levels of all three VCA gain control signals at the outputs of signal adders 34, 36 and 38.

A temperature detecting circuit 174 provides a DC output signal which varies as a linear function of circuit temperature. The output of temperature detector 174 is subtracted from the gain adjustment signal by signal subtractor 172, thereby providing a gain adjustment signal which varies as a function of temperature. The temperature sensitivity feature is included to compensate for the inverse temperature sensitivity of the voltage controlled amplifiers connected to the outputs of the adders 34, 36 and 38.

The static gains in the high band and low band channels can also be adjusted independently of gain adjustment potentiometer 170 in order to provide static frequency response equalization. Static equalization potentiometers 176 and 178 are provided for this purpose. Potentiometers 176 and 178 have their wiper arms connected as inputs to adders 34 and 38, respectively, permitting separate adjustment of the DC signals applied to the high band and low band voltage controlled amplifiers.

Figure 4:
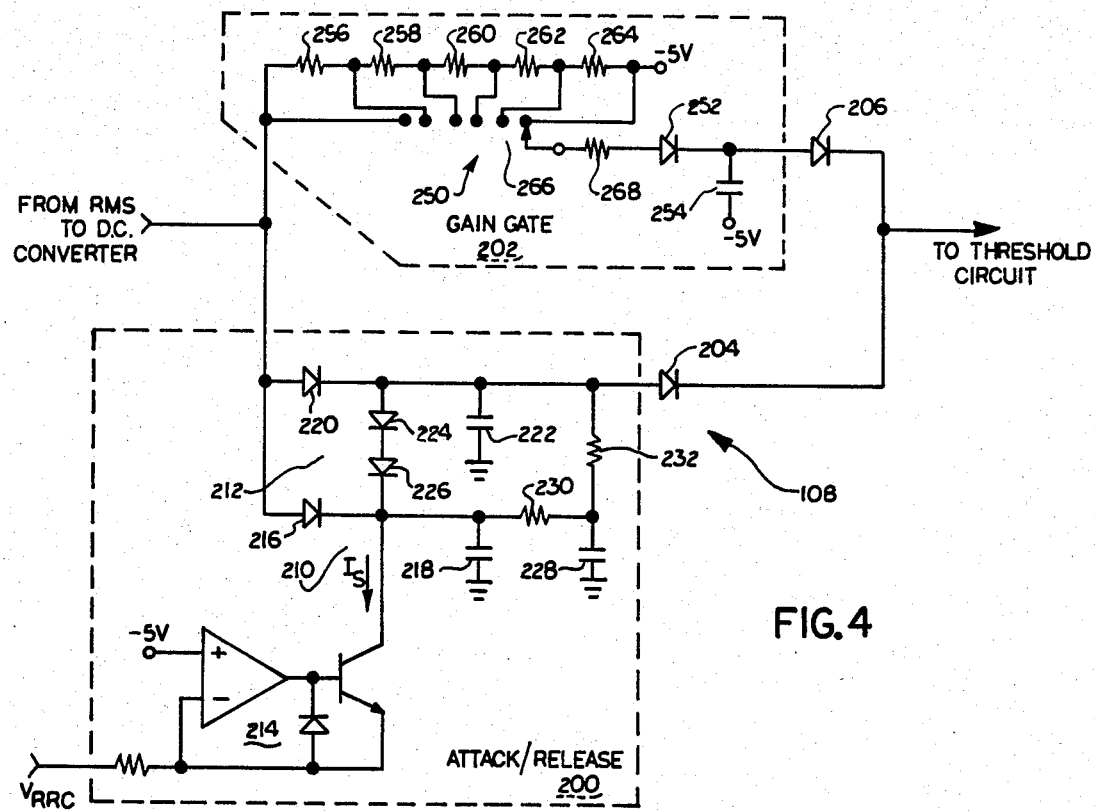
FIG. 4 is a more detailed circuit schematic of one of the compliance networks used in the FIG. 3 gain control circuitry.

FIG. 4 is a more detailed circuit schematic of the compliance network 108 of FIG. 3. The other two compliance networks 106 and 110 are identical, and will not be described separately. Compliance network 108 includes two principal sections, an attack/release circuit 200 and a gain gate 202. The attack/release circuit 200 and gain gate 202 both have their inputs coupled to the input of the compliance network 108. The outputs of the two circuit sections are diode "OR"ed together with diodes 204 and 206. The diodes 204 and 206 nonadditively mix the outputs of the two circuit sections, much in the same way as the diodes 138 and 140 of the threshold section nonadditively mix the output of buffer amplifier 136 with a DC threshold voltage. Attack/release circuit 200 provides the control voltage which varies dynamically as a short term function of the peak output of the RMS-to-DC converter. It is this control voltage which usually controls the gain of the voltage controlled amplifiers. Gain gate circuit 202 provides a voltage level which instead varies as a long term function of the peak output of the RMS-to-DC converter. This long term voltage level, in essence, sets a dynamically varying gain ceiling above which the gain in that channel is not permitted to rise.

Attack/release circuit 200 includes two parallel-connected peak detectors 210 and 212, and a voltage controlled current sink 214. The current sink 214 controls the rate at which the capacitors in the peak detectors are discharged. Peak detector 210 includes a series-connected rectifying diode 216 and a shunt capacitor 218, whereas peak detector 212 includes a rectifying diode 220 and a shunt capacitor 222. The two shunt capacitors are cross coupled by a pair of diodes 224 and 226.

As the input signal applied to the input of compliance network 108 rises, the capacitors 218 and 222 both are charged to the peak value of that input signal. The diodes 224 and 226 are nonconductive at that time since the voltages on either side of the diodes are equal. After the input signal retreats from its peak value, capacitor 218 begins discharging due to current flow through the voltage controlled current sink 214. The rate at which the voltage across capacitor 218 decreases is principally dependent upon the magnitude of the current $I_S$ sunk by the current sink 214. After a short period of time, the capacitor 218 will have discharged more than two diode drops below the voltage across capacitor 222. Both of diodes 224 and 226 will thus become forward biased, after which capacitor 222 will discharge along with capacitor 218. The rate of discharge will be reduced, however, since the discharge current remains fixed at $I_S$.

Since the output signal of the attack/release circuit 200 is taken from across the capacitor 222, the output of attack/release circuit 220 will experience a brief delay following the passage of the peak input signal before the decay of the gain control signal begins. The brief delay is advantageous since it prevents the gain control signal from decaying during the brief interval between cycles of the input signals. Thus, the delay reduces modulation of the gain of the midband signal by the envelope of the output of the RMS-to-DC converter.

An integrating capacitor 228 is coupled to capacitor 218 through a resistor 230, and to capacitor 222 through a second resistor 232. Capacitor 228 develops a voltage which is, in essence, the average of the voltage across capacitor 218 (resistor 230 is much smaller than resistor 232, in the example being described). The inclusion of capacitor 228 adds another time constant to the attack/release circuit. As long as the voltage across capacitor 218 is greater than the voltage across capacitor 228, capacitor 218 will discharge not only through the voltage controlled current sink 214, but also through resistor 230 into capacitor 228. Capacitor 218 will thus discharge relatively quickly. When the voltage across capacitor 218 drops below the voltage across capacitor 228, however, current will flow from capacitor 228 to capacitor 218, rather than vice versa. The discharge rate of capacitor 218 will thus diminish. The net effect of this double time constant is that the gain control signal provided by attack/release circuit 200 will attack very quickly as the magnitude of the input audio signal increases, and will thereafter decay at two different rates. Initially, the decay rate will be relatively rapid, leading to a rapid recovery in the gain of the voltage controlled amplifiers. Once the gain control signal reaches the average of previous gain control signal, however, the gain of the voltage controlled amplifiers will expand at a reduced rate.

Gain gate circuit 202 in essence comprises another peak detector circuit, though with a voltage divider 250 at its input. The peak detector circuit includes a rectifying diode 252 and a shunt capacitor 254. The voltage divider network 250 includes five resistors 256–264 connected in series between the input of the compliance network 108 and a −5 volt supply line. A rotary switch 266 enables the junction between any two of the five resistors to be coupled to a fixed resistor 268 connected in series with the diode 252. The degree of attenuation of the input signal can thus be selected by selecting the position of the rotary switch 266. The voltage across the capacitor 254 will reflect the peak amplitude of the attenuated input signal. The voltage across capacitor 254 represents the output of the gain gate circuit 202, and thus establishes the gain ceiling above which the gain of the voltage controlled amplifier in the midband will not be permitted to rise.

Figure 5:
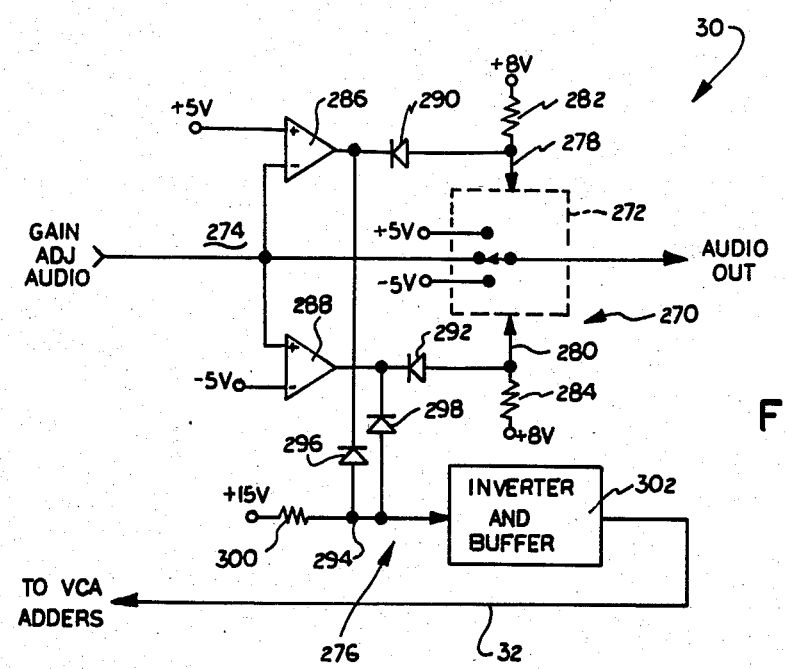
FIG. 5 is a more detailed circuit schematic of the signal clipper of FIG. 1.

FIG. 5 is a more detailed circuit schematic of the clipper/limiter circuit 30 shown in block form in FIG. 1. The clipper/limiter includes a switching clipper circuit 270 comprised of a switch circuit 272 and a window comparator 274. The clipper/limiter also includes a circuit 276 for deriving a limiter control voltage from the output signals provided by the window comparator 274. As stated previously, the limiter control signal is directed to the adders 34, 36 and 38 (FIG. 1).

The solid state switching circuit 272 included in the switching clipper 270 is modelled in FIG. 5 as a single pole, triple throw switch. The switch has its central terminal connected to the input line, and the other two terminals connected to voltage sources providing voltage signals representative of the desired positive and negative clipping limits (±5 volts in the embodiment shown in FIG. 5). The state of the switch circuit 272 is controlled by two control input lines 278 and 280. Control lines 278 and 280 are connected to an 8 volt supply line through respective resistors 282 and 284. If the voltages on both control lines 278 and 280 are high (at 8 volts), then the switch will be in the state shown, with the output connected to the center terminal. The audio signal will then pass through the limiter without alteration. If control line 278 is at a low voltage level, however, the switch 272 will be in the upper position (as viewed in FIG. 5), resulting in the output line being directly connected to a +5 volt source. If, instead, the control line 280 is at a low voltage level, the output line will instead be connected to a −5 volt source. The control lines are connected to and controlled by the outputs of the window comparator.

Window comparator 274 includes two operational amplifiers 286 and 288 for comparing the gain adjusted audio signal with positive and negative threshold limits (±5 volts in the example being described). The output of operational amplifier 288 is coupled to control line 278 through a diode 290, whereas the output of operational amplifier 288 is connected to control line 280 through diode 292.

As long as the gain adjusted audio input signal is between ±5 volts, the outputs of both operational amplifiers 286 and 288 will be at high levels, hence the diodes 290 and 292 will be reverse biased and the control switch 272 will in the position shown. Thus, as long as the gain adjusted audio signal remains between the positive and negative clipping limits, it is coupled to the output without change. If the gain adjusted audio input signal exceeds 5 volts, however, the output of operational amplifier 286 will drop to a low voltage, pulling the voltage on control line 278 low and causing the switch 272 to switch to the upper position. In that position, the output signal is fixed at 5 volts, thus preventing the audio output signal from exceeding the 5 volt limit. Similarly, if the gain adjusted audio signal drops below −5 volts, the output of comparator 288 will drop low, pulling the voltage on control line 280 low and causing the switch 272 to move to the lower position. A −5 volt DC level will then be substituted for the gain adjusted audio signal, in essence clipping the audio input at the −5 volt limit.

The circuit 276 develops the limiter control signal at a circuit node 294 in response to the output signals generated by the window comparator 274. The circuit node 294 is coupled to the outputs of the window comparators 286 and 288 through a diode "OR" gate comprised of respective diodes 296 and 298, and to a +15 volt DC source through a resistor 300. Due to the diode gate, the voltage at circuit node 294 will be low whenever either comparator output is low. In other words, the node voltage will be high as long as the gain adjusted audio signal is within the "window", and will be low when it is outside of the window. The node voltage thus indicates whether limiting action is, or is not, required. The node voltage is applied to the VCA adders 34, 36 and 38 through a circuit 302. The circuit 302 inverts, filters, and buffers the node voltage.

The system thus includes two different types of signal limiters: a switching limiter 270 and the limiter formed by the loop including circuit 276 and the voltage controlled amplifiers 16, 18, and 20. When the gain adjusted audio signal moves outside of the window, the switch 272 is immediately actuated, producing immediate clipping action. At the same time, the gains of the three VCA's are simultaneously reduced by the amount necessary to bring the gain adjusted audio signal back within the window. The gain reduction will be too late to prevent a sharp transition to hard limiting at the leading edge of the clipping interval. By the trailing edge of the clipping interval, however, the gain control loop has already reduced gain sufficiently to provide a smooth transition back to linear (nonlimiting) operation. The gain controlling limiter thus reduces the harmonic distortion which would be caused by the sharp transition which would otherwise occur at the trailing edge of each clipping interval. The gain controlling limiter is relatively low cost, moreover, because it uses the gain blocks used in the individual channels of the AGC circuit.

Although the invention has been described with respect to a preferred embodiment, it will be appreciated that various rearrangements and alterations of parts may be made without departing from the spirit and scope of the present invention, as defined in the appended claims.

Having described specific preferred embodiments of the invention, the following is claimed:

1. Audio signal processing apparatus comprising:
   band splitter means responsive to an input audio signal for separating the audio signal into plural frequency components;
   plural gain adjustment means for each controlling the gain of an associated one of said components, each said gain adjustment means including variable gain means for gain adjusting the corresponding component, and feed forward control means for controlling the gain of said variable gain means as a function of the magnitude of the associated said component;
   signal combining means for combining the gain adjusted components provided by said plural gain adjustment means to thereby form a gain adjusted audio signal; and
   limiter means for preventing the combined signal from exceeding predetermined amplitude constraints, said limiter means including means for simultaneously reducing the gains of all said variable gain means whenever said gain adjusted audio signal exceeds said constraints.

2. Apparatus as set forth in claim 1, wherein each said feed forward control means includes means for providing an associated gain control signal, wherein said limiter means also provided a gain control signal, and wherein said apparatus further comprises means for combining said limiter gain control signal with each said feed forward gain control signal to thereby form plural combined gain control signals, each said combined signal being applied to a gain control input of a corresponding said variable gain means.

3. Apparatus as set forth in claim 1, wherein said limiter means includes comparator means for comparing said gain adjusted audio signal with threshold signals representative of said amplitude constraints, and means for providing a gain control signal in accordance with the results of said comparisons.

4. Apparatus as set forth in claim 3, wherein said limiter means further comprises means for clipping said gain adjusted audio signal at selected amplitude limits.

5. Apparatus as set forth in claim 1, wherein said limiter means comprises means for comparing said gain adjusted audio signal with at least one threshold representative of a predetermined amplitude constraint, means for simultaneously reducing the gains of all of said variable gain means whenever said gain adjusted audio signal exceeds said threshold, and means for clipping said gain adjusted audio signal at said threshold.

6. Audio signal processing apparatus comprising:
   band splitter means responsive to an input audio signal for separating it into plural frequency components;
   plural gain adjustment means for each controlling the gain of an associated one of said components, each said gain adjustment means including variable gain means for gain adjusting the corresponding component, and feed forward control means for controlling the gain of said variable gain means as a function of the magnitude of the associated said component; and
   signal combining means for combining the gain adjusted components provided by said plural gain adjustment means to thereby form a gain adjusted audio signal,
   wherein each said feed forward control means includes attack/release means for generating a first signal which varies dynamically as a short term function of the corresponding said component, gain gate circuit means for generating a second signal which varies as a long term function of said component, and means for controlling the corresponding said variable gain means as a function of both said first and second signals.

7. Apparatus as set forth in claim 6, wherein each said means for controlling comprises means for nonadditively mixing said first and second signals, and means for utilizing the resulting mixed signal to control the gain of the corresponding said variable gain means.

8. Apparatus as set forth in claim 7, wherein each said utilizing means comprises means for comparing said mixed signal with a threshold and for reducing the gain of the corresponding said variable gain means whenever said mixed signal goes beyond said threshold.

9. Apparatus as set forth in claim 6, wherein each said feed forward control means further comprises means for generating a DC signal representative of the RMS value of the corresponding said component, and wherein the corresponding said attack/release means and gain gate means are each responsive to said DC signal for generating said first and second signals.

10. Apparatus as set forth in claim 9, wherein each said attack/release means includes first and second peak detectors commonly coupled to the output of the corresponding said DC signal generating means, said first signal comprising the signal appearing at the output of said first peak detector, diode means coupling the output of said first peak detector to the output of said second peak detector, and release means for discharging said second peak detector, said diode means delaying the discharge of said first peak detector after each peak of said DC signal.

11. Apparatus as set forth in claim 10, wherein each said release means includes voltage controlled constant current means.

12. Apparatus as set forth in claim 11, and further comprising means for providing a single release rate control signal to all of said voltage controlled constant current means, whereby the release rates of all of said attack/release means are simultaneously controlled by said release rate control signal.

13. Audio signal processing apparatus comprising means for receiving an audio signal for processing, variable gain means responsive to said audio signal for gain adjusting said signal in accordance with the value of a gain control signal to thereby provide a gain adjusted audio signal, and feed forward control means for generating said gain control signal as a function of the magnitude of said audio signal, wherein said feed forward control means includes first circuit means for generating a first signal which varies dynamically as a short term function of said audio signal, second circuit means for generating a second signal which varies as a long term function of said audio signal, and means responsive to said first and second signals for providing a said gain control signal which is generally a function of said first signal but is limited by said second signal such that said second signal effectively establishes the gain ceiling of said variable gain means.

14. Apparatus as set forth in claim 13, wherein said feed forward control means further comprises RMS-to-DC converter means responsive to said audio signal for generating a DC signal which follows the RMS value of said audio signal, said first and second circuit means being responsive to said DC signal for generating said first and second signals.

15. Apparatus as set forth in claim 14, wherein said first circuit means comprises an attack/release circuit.

16. Apparatus as set forth in claim 14, wherein said second circuit means comprises means for generating a said second signal which is a selected fraction of the peak value of said DC signal.

17. Apparatus as set forth in claim 15, wherein said attack/release circuit includes first and second peak detectors commonly coupled to the output of said RMS-to-DC converter, said first signal comprising the output signal provided by said first peak detector, diode means coupling the output of said first peak detector to the output of said second peak detector, and release means for discharging said second peak detector, said diode means introducing a delay in the discharge of said first peak detector after each peak of said DC signal.

18. Apparatus as set forth in claim 13, wherein said feed forward means further comprises means for providing a DC signal functionally related to the magnitude of said audio signal, and wherein said first circuit means comprises first and second peak detectors commonly coupled to receive said DC signal, said first signal comprising the output signal provided by said first peak detector, diode means coupling the output of said first peak detector to the output of said second peak detector, and release means for discharging said second peak detector, said diode means briefly delaying the discharging of said first peak detector after each peak of said DC signal.

19. Apparatus as set forth in claim 18, wherein said means for providing a DC signal comprises RMS-to-DC converter means.

20. Apparatus as set forth in claim 18, wherein said release means comprises means for providing a constant discharging current.

* * * * *